(12) United States Patent
Woo

(10) Patent No.: US 12,131,929 B2
(45) Date of Patent: Oct. 29, 2024

(54) WAFER INSPECTION METHOD

(71) Applicant: SEMES CO., LTD., Cheonan-si (KR)

(72) Inventor: Myoung Hoon Woo, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 408 days.

(21) Appl. No.: 17/534,716

(22) Filed: Nov. 24, 2021

(65) Prior Publication Data

US 2022/0208580 A1 Jun. 30, 2022

(30) Foreign Application Priority Data

Dec. 28, 2020 (KR) ........................ 10-2020-0184881

(51) Int. Cl.
| | |
|---|---|
| *G06K 9/00* | (2022.01) |
| *G06T 7/00* | (2017.01) |
| *G06T 7/11* | (2017.01) |
| *G06T 7/70* | (2017.01) |
| *G06T 7/90* | (2017.01) |
| *H01L 21/67* | (2006.01) |

(52) U.S. Cl.
CPC ...... *H01L 21/67288* (2013.01); *G06T 7/0004* (2013.01); *G06T 7/11* (2017.01); *G06T 7/70* (2017.01); *G06T 7/90* (2017.01); *G06T 2207/10024* (2013.01); *G06T 2207/30148* (2013.01)

(58) Field of Classification Search
CPC .................. G06T 2207/30148; G01N 21/9501
See application file for complete search history.

(56) References Cited

U.S. PATENT DOCUMENTS

| | | | |
|---|---|---|---|
| 7,486,878 B2 | 2/2009 | Chen et al. | |
| 2022/0268569 A1* | 8/2022 | Srocka | ............... G01B 11/0608 |
| 2023/0197480 A1* | 6/2023 | Kiyotomi | .......... H01L 21/67178 |
| | | | 118/713 |

FOREIGN PATENT DOCUMENTS

| | | | |
|---|---|---|---|
| JP | 2009-198395 | 9/2009 | |
| KR | 10-2009-0057426 | 6/2009 | |
| WO | WO-2010044433 A1 * | 4/2010 | ......... G01N 21/9501 |

OTHER PUBLICATIONS

Korean Office Action with English translation for Korean Patent Application No. 10-2020-0184881, dated Mar. 22, 2023.

* cited by examiner

*Primary Examiner* — Andrew M Moyer
*Assistant Examiner* — Aidan Keup
(74) *Attorney, Agent, or Firm* — KILE PARK REED & HOUTTEMAN PLLC

(57) ABSTRACT

A wafer inspection method includes acquiring an inspection image from an edge region of a wafer, generating a color profile of the inspection image in a radial direction of the wafer, detecting a side surface of a layer formed on the wafer based on a change in the color profile in a first direction from a side surface of the wafer toward a center of the wafer, and calculating a distance between the side surface of the layer and the side surface of the wafer.

16 Claims, 6 Drawing Sheets

WAFER INSPECTION METHOD

CROSS-REFERENCE TO RELATED APPLICATION

This application claims the priority benefit of Korean Patent Application No. 10-2020-0184881, filed on Dec. 28, 2020, and all the benefits accruing therefrom under 35 U.S.C. § 119, the contents of which are incorporated by reference in their entirety.

TECHNICAL FIELD

The present disclosure relates to a wafer inspection method. More specifically, the present disclosure relates to a wafer inspection method of inspecting a distance between a side surface of a wafer and a side surface of a layer formed on the wafer.

BACKGROUND

Semiconductor devices may be formed on a substrate such as a silicon wafer by repeatedly performing a series of manufacturing processes. For example, a deposition process may be performed to form a layer on the wafer, a photolithography process may be performed to form a photoresist pattern on the layer, an etching process may be performed to pattern the layer formed on the wafer by using the photoresist pattern as an etching mask, and a planarization process may be performed to planarize the layer formed on the wafer.

The photolithography process may include a coating process forming a photoresist layer on the wafer, and an exposure process and a development process patterning the photoresist layer so as to form the photoresist pattern. Meanwhile, an edge portion of the photoresist layer may be removed by an Edge Bead Removal (EBR) process or an Edge Exposure of Wafer (EEW) process to reduce particle generation in subsequent processes.

Further, an inspection process may be additionally performed on an edge region (hereinafter, referred to as an 'EBR region') of the wafer exposed by removing the edge portion of the photoresist layer. Specifically, an apparatus for performing the inspection process on the EBR region may irradiate a light onto the EBR region, detect a light reflected from the EBR region, and calculate a width of the EBR region by analyzing the detected light. Further, the EBR inspection apparatus may rotate the wafer, and may repeatedly measure the width of the EBR region while rotating the wafer.

However, in order to perform the EBR inspection process as described above, the EBR inspection apparatus is required separately from an apparatus for performing the EBR process. Accordingly, a considerable amount of time and cost may be required to transfer the wafer to the EBR inspection apparatus and to perform the EBR inspection process using the EBR inspection apparatus.

SUMMARY

Embodiments of the present invention provide a wafer inspection method capable of reducing time and cost for inspecting a wafer and improving reliability of inspection results.

In accordance with an aspect of the present invention, a wafer inspection method may include acquiring an inspection image from an edge region of a wafer, generating a color profile of the inspection image in a radial direction of the wafer, and detecting a side surface of a layer formed on the wafer based on a change in the color profile in a first direction from a side surface of the wafer toward a center of the wafer.

In accordance with some embodiments of the present invention, the acquiring the inspection image may include acquiring a color image of the wafer by imaging the wafer, extracting a ring-shaped first image corresponding to the edge region of the wafer from the color image, converting the first image into a ribbon-shaped second image, and extracting a portion of the second image to acquire the inspection image.

In accordance with some embodiments of the present invention, the color profile may include color level values and gray level values constituting the inspection image.

In accordance with some embodiments of the present invention, the color profile may include color ratio values calculated from the color level values.

In accordance with some embodiments of the present invention, the generating the color profile may include detecting red level values, green level values, blue level values and gray level values of pixels constituting the inspection image, calculating level average values of the red level values, the green level values, the blue level values and the gray level values in a second direction perpendicular to the first direction, and generating color level profiles and a gray level profile of the inspection image in the first direction using the level average values.

In accordance with some embodiments of the present invention, the generating the color profile may further include generating color ratio profiles of the inspection image using the color level profiles of the inspection image.

In accordance with some embodiments of the present invention, the detecting the side surface of the layer may include selecting one color from among red, green and blue according to a color of the layer, and searching a color ratio profile corresponding to the selected color from among the color ratio profiles in the first direction to detect a pixel having a predetermined color ratio of the selected color.

In accordance with some embodiments of the present invention, the detecting the side surface of the layer may further include searching the color ratio profile in the first direction from the detected pixel to detect a second pixel having the predetermined color ratio of the selected color when a color level value of the selected color of the detected pixel or a gray level value of the detected pixel is lower than a predetermined value.

In accordance with some embodiments of the present invention, the searching in the first direction may be skipped for pixels in which a color level value of the selected color or a gray level value is lower than a predetermined value.

In accordance with some embodiments of the present invention, when an inflection point exists in a section higher or lower than the predetermined color ratio in the color ratio profile, the pixel having the predetermined color ratio may be detected by searching the color ratio profile in the first direction from the inflection point.

In accordance with some embodiments of the present invention, the wafer inspection method may further include calculating a distance between the side surface of the layer and the side surface of the wafer.

In accordance with another aspect of the present invention, a wafer inspection method may include acquiring a color image of a wafer by imaging the wafer, extracting an inspection image corresponding to a portion of an edge region of the wafer from the color image, generating color ratio profiles of the inspection image in a radial direction of the wafer, detecting a side surface of a layer formed on the wafer based on a change in one of the color ratio profiles in a first direction from a side surface of the wafer toward a center of the wafer, and calculating a distance between the side surface of the layer and the side surface of the wafer.

In accordance with some embodiments of the present invention, the extracting the inspection image may include extracting a ring-shaped first image corresponding to the edge region of the wafer from the color image, converting the first image into a ribbon-shaped second image, and extracting a portion of the second image to acquire the inspection image.

In accordance with some embodiments of the present invention, the generating the color ratio profiles may include detecting red level values, green level values and blue level values of pixels constituting the inspection image, calculating level average values of the red level values, the green level values and the blue level values in a second direction perpendicular to the first direction, generating a red level profile, a green level profile and a blue level profile of the inspection image in the first direction using the level average values, and generating a red ratio profile, a green ratio profile and a blue ratio profile of the inspection image in the first direction using the level average values.

In accordance with some embodiments of the present invention, the detecting the side surface of the layer may include selecting one color from among red, green and blue according to a color of the layer, and searching a color ratio profile corresponding to the selected color from among the color ratio profiles in the first direction to detect a pixel having a predetermined color ratio of the selected color.

In accordance with some embodiments of the present invention, the wafer inspection method may further include generating a gray level profile of the inspection image in the radial direction of the wafer.

In accordance with some embodiments of the present invention, the generating the gray level profile may include detecting gray level values of pixels constituting the inspection image, calculating level average values of the gray level values in a second direction perpendicular to the first direction, and generating the gray level profile of the inspection image in the first direction using the level average values.

In accordance with some embodiments of the present invention, the detecting the side surface of the layer may further include searching the color ratio profile in the first direction from the detected pixel to detect a second pixel having the predetermined color ratio of the selected color when a gray level value of the detected pixel is lower than a predetermined value.

In accordance with some embodiments of the present invention, the searching in the first direction may be skipped for pixels in which a gray level value is lower than a predetermined value.

In accordance with still another aspect of the present invention, a wafer inspection method may include acquiring a color image of a wafer by imaging the wafer, extracting a ring-shaped first image corresponding to an edge region of the wafer from the color image, converting the first image into a ribbon-shaped second image, extracting a portion of the second image to acquire an inspection image, merging pixels of the inspection image in a second direction perpendicular to a first direction from a side surface of the wafer toward a center of the wafer to acquire a second inspection image having a line shape extending in the first direction, generating a color profile of the second inspection image in the first direction, and detecting a side surface of a layer formed on the wafer based on a change in the color profile in the first direction.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
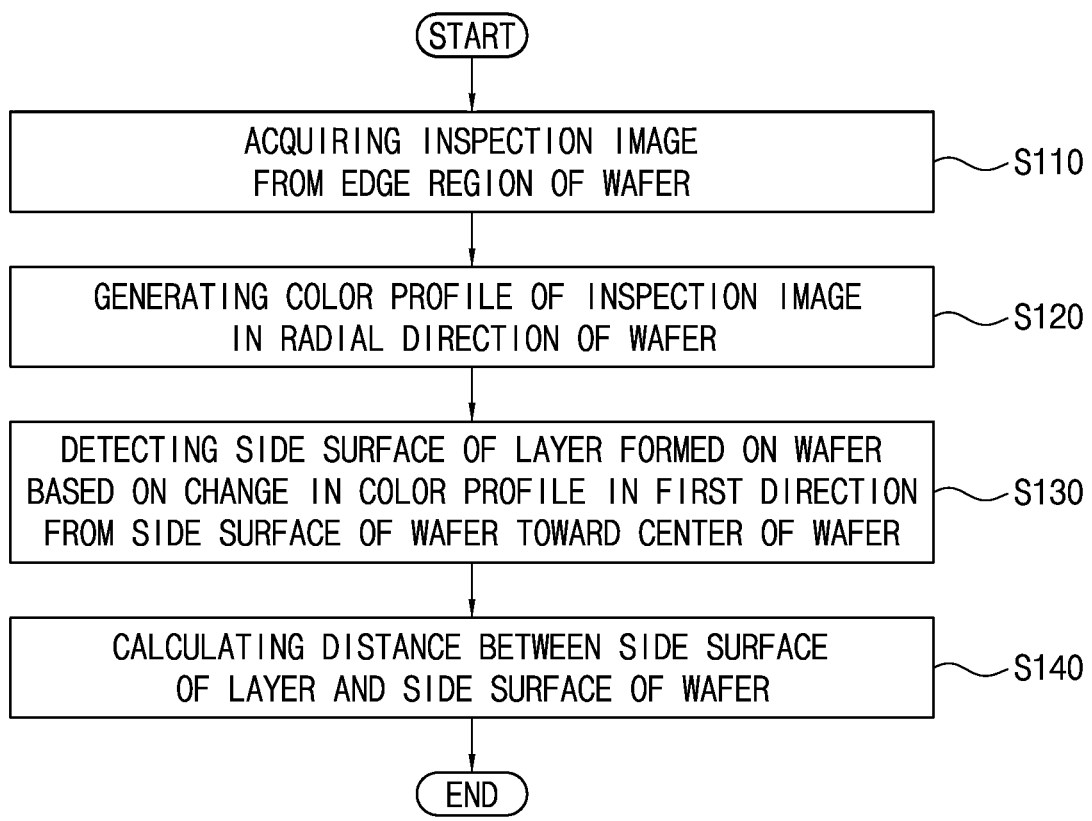
FIG. 1 is a flowchart illustrating a wafer inspection method in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
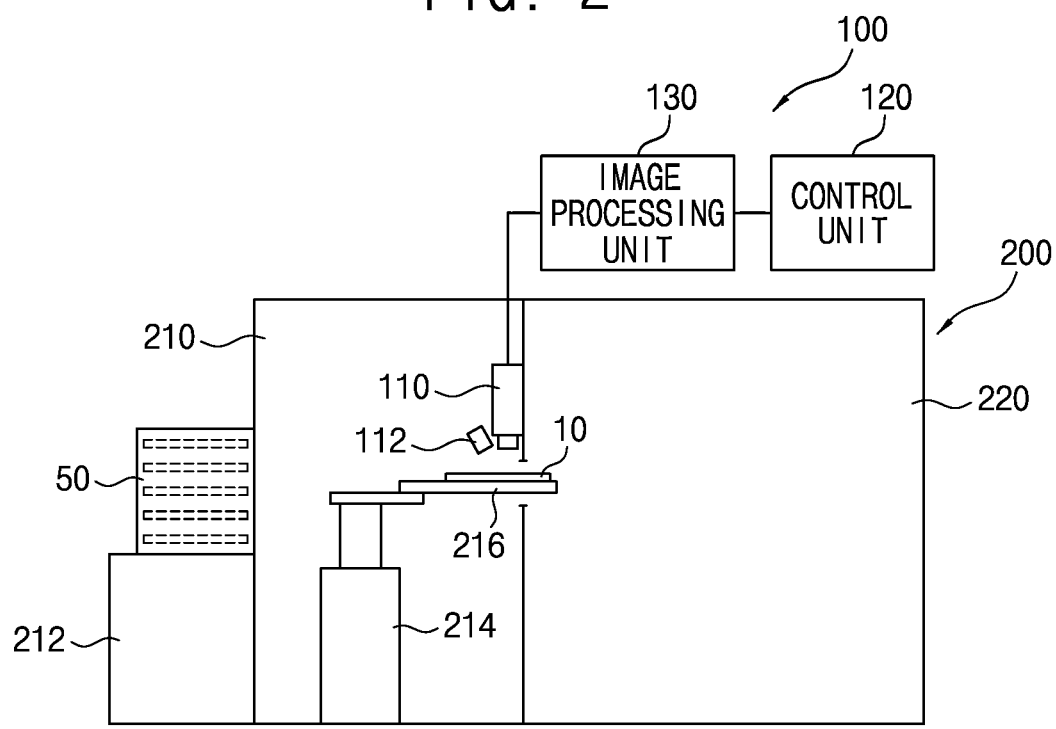
FIG. 2 is a schematic view illustrating a wafer inspection apparatus suitable for performing the wafer inspection method as shown in FIG. 1.
Figure 3:
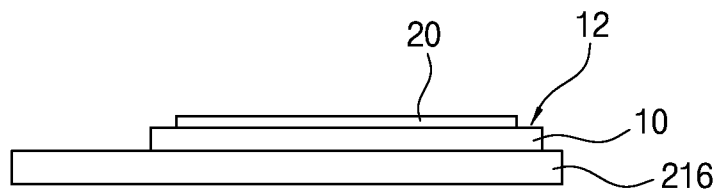
FIG. 3 is a schematic view illustrating a wafer as shown in FIG. 2.

FIG. 1 is a flowchart illustrating a wafer inspection method in accordance with an embodiment of the present invention, FIG. 2 is a schematic view illustrating a wafer inspection apparatus suitable for performing the wafer inspection method as shown in FIG. 1, and FIG. 3 is a schematic view illustrating a wafer as shown in FIG. 2.

Referring to FIGS. 1 and 2, a wafer inspection method according to an embodiment of the present invention may be used to inspect a wafer 10 in a manufacturing process of semiconductor devices. Particularly, the wafer inspection method may be used to inspect a width of an edge region of the wafer 10, that is, an EBR region 12 after removing an edge portion of a photoresist layer 20 formed on the wafer 10.

A wafer inspection apparatus 100 for performing the wafer inspection method may be disposed between an EBR process module 220 for removing the edge portion of the photoresist layer 20 and a wafer transfer module 210 for transferring the wafer 10. That is, the wafer inspection apparatus 100 may be disposed in an EBR process apparatus 200 for performing an EBR process. The wafer transfer module 210 may include a load port 212 on which a cassette 50 for accommodating the wafer 10 is placed, and a wafer transfer robot 214 for transferring the wafer 10 between the cassette 50 and the EBR process module 220, and the wafer inspection apparatus 100 may acquire a color image of the wafer 10 by imaging the wafer 10 transferred by the wafer transfer robot 214.

Specifically, after the EBR process is performed by the EBR process module 220, the wafer 10 may be transferred into the cassette 50 by the wafer transfer robot 214, and the wafer inspection apparatus 100 may image the wafer 10 transferred by the wafer transfer robot 214. For example, the wafer transfer robot 214 may include a robot arm 216 for transferring the wafer 10, and the wafer inspection apparatus 100 may include a camera unit 110 disposed above a transfer path of the wafer 10 and configured to image the wafer 10.

A line scan camera may be used as the camera unit 110, and an illumination unit 112 for providing illumination light onto the wafer 10 may be disposed on one side of the line scan camera 110. Further, the wafer inspection apparatus 100 may include a control unit 120 for controlling operations of the camera unit 110 and the illumination unit 112. The control unit 120 may operate the illumination unit 112 according to the operation of the wafer transfer robot 214, and may control the operation of the camera unit 110 so that the camera unit 110 captures the transfer path of the wafer 10 for a predetermined time after the illumination unit 112 is operated.

For example, the EBR process apparatus 200 may generate event log files related to the operation of the wafer transfer robot 214, and the control unit 120 may operate the illumination unit 112 based on the event log files. Specifically, the EBR process apparatus 200 may generate an event log file that records the time when the transfer of the wafer 10 is started by the wafer transfer robot 214, and the control unit 120 may turn on the illumination unit 112 based on the transfer start time of the wafer 10 recorded in the event log file. Further, the control unit 120 may control the operation of the camera unit 110 to image the transfer path of the wafer 10 after the illumination unit 112 is turned on, thereby acquiring the color image of the wafer 10.

In accordance with an embodiment of the present invention, the wafer inspection apparatus 100 may include an image processing unit 130 for processing the color image of the wafer 10 acquired by the camera unit 110. The image processing unit 130 may extract a ring-shaped first image corresponding to the edge region of the wafer 10 from the color image of the wafer 10, and may convert the first image into a ribbon-shaped second image. For example, the first image may have a circular ring shape, and the second image may have a ribbon shape having a predetermined width in a first direction from a side surface of the wafer 10 toward a center of the wafer 10 and extending in a second direction perpendicular to the first direction.

Figure 4:
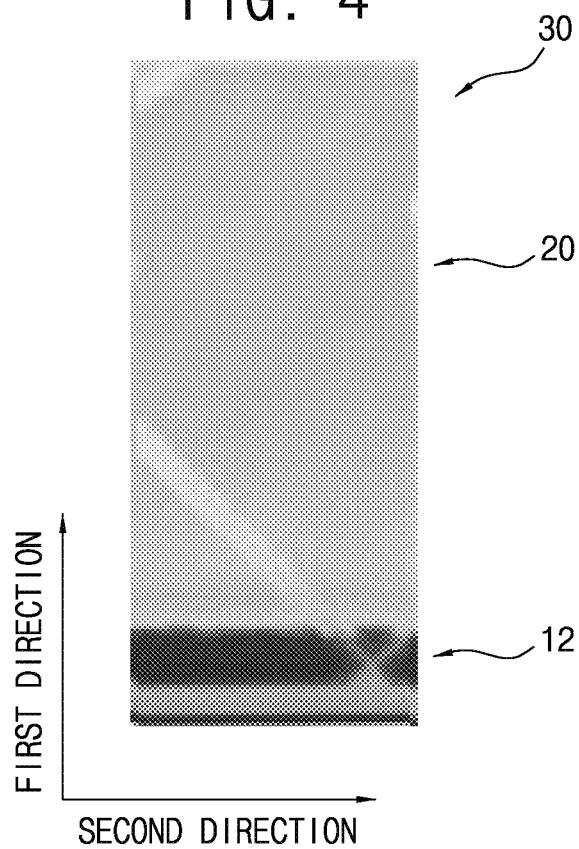
FIG. 4 is an example of an inspection image acquired by an image processing unit as shown in FIG. 1.

Further, the image processing unit 130 may extract a portion of the second image to acquire an inspection image 30 (refer to FIG. 4). In particular, the image processing unit 130 may extract a plurality of inspection images 30 from the second image to inspect the width of the EBR region 12. For example, the inspection image 30 may include 300 pixels in the first direction, and may include 100 pixels in the second direction. That is, the inspection image 30 may have a size of 300×100. As another example, the inspection image 30 may have a line shape including 300 pixels in the first direction.

Figure 5:
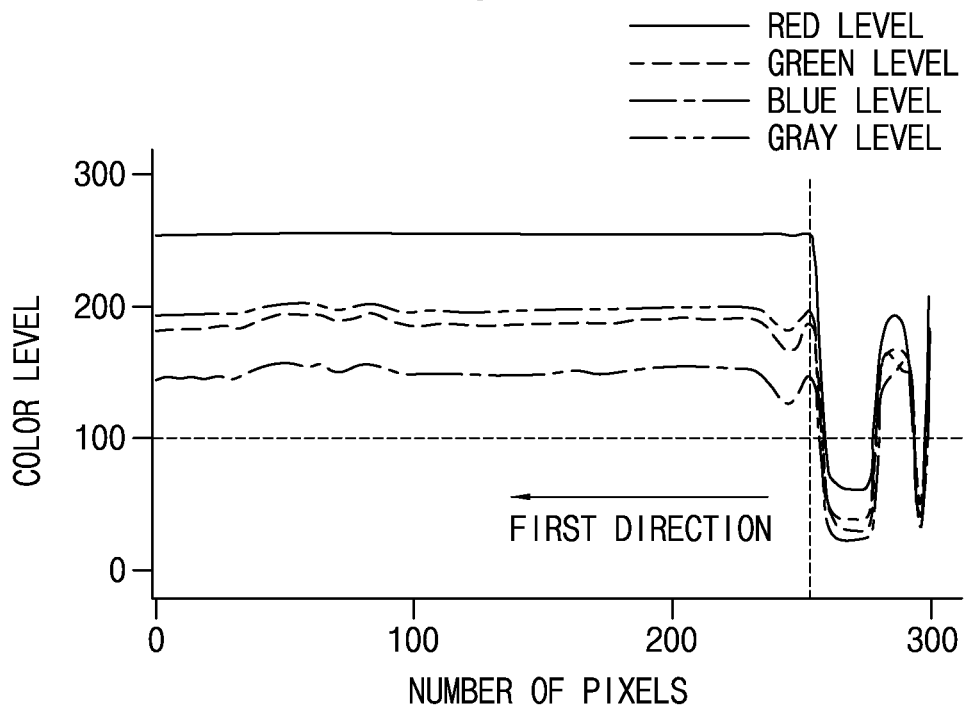
FIG. 5 is a graph illustrating color level profiles and a gray level profile generated from the inspection image as shown in FIG. 4.
Figure 6:
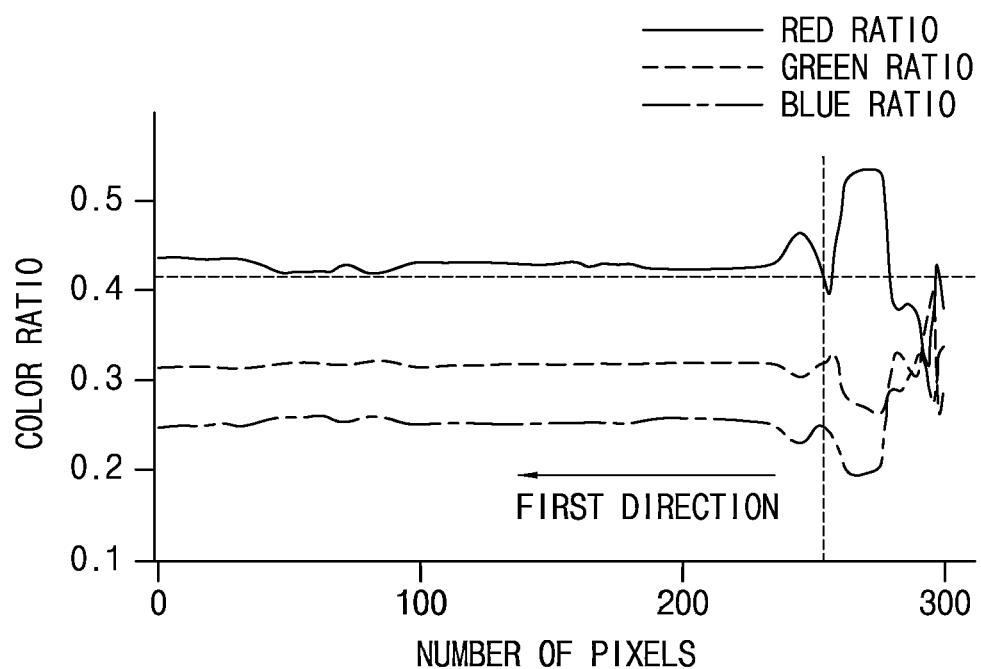
FIG. 6 is a graph illustrating color ratio profiles generated from the color level profiles as shown in FIG. 5.
Figure 7:
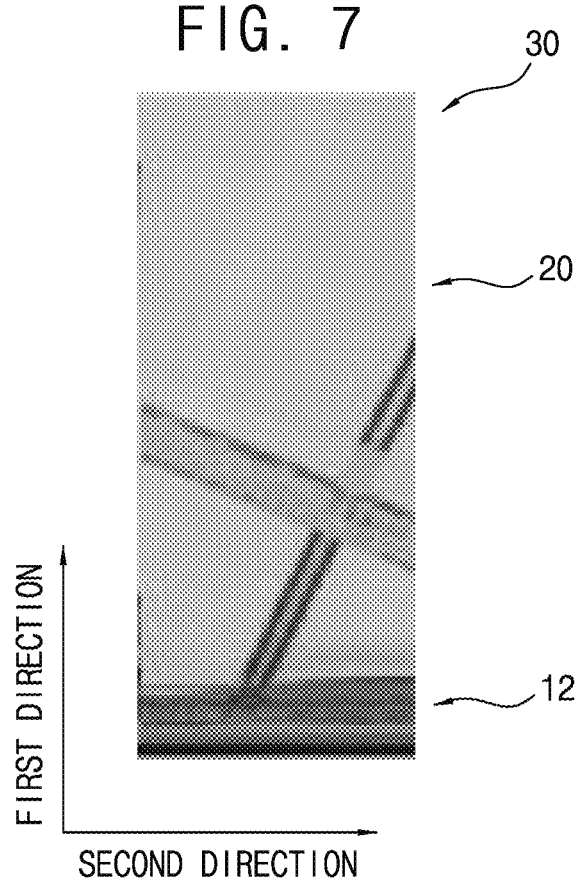
FIG. 7 is another example of the inspection image acquired by the image processing unit as shown in FIG. 1.
Figure 8:
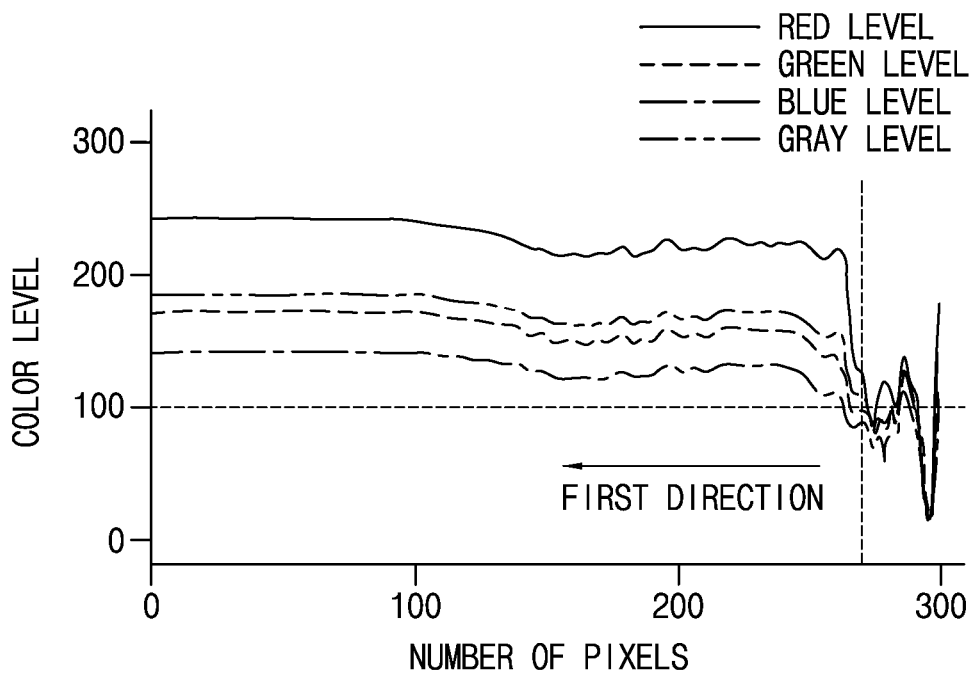
FIG. 8 is a graph illustrating color level profiles and a gray level profile generated from the inspection image as shown in FIG. 7.
Figure 9:
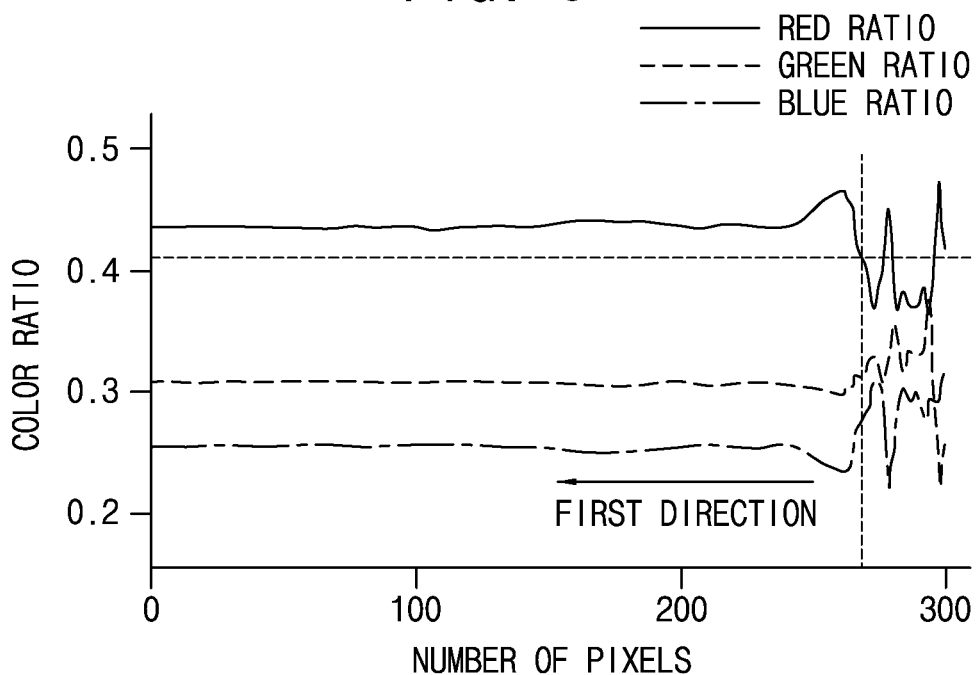
FIG. 9 is a graph illustrating color ratio profiles generated from the color level profiles as shown in FIG. 8.

FIG. 4 is an example of the inspection image acquired by the image processing unit as shown in FIG. 1, FIG. 5 is a graph illustrating color level profiles and a gray level profile generated from the inspection image as shown in FIG. 4, and FIG. 6 is a graph illustrating color ratio profiles generated from the color level profiles as shown in FIG. 5. FIG. 7 is another example of the inspection image acquired by the image processing unit as shown in FIG. 1, FIG. 8 is a graph illustrating color level profiles and a gray level profile generated from the inspection image as shown in FIG. 7, and FIG. 9 is a graph illustrating color ratio profiles generated from the color level profiles as shown in FIG. 8.

Referring to FIGS. 4 to 9, the image processing unit 130 may generate a color profile of the inspection image 30 to detect a side surface of the photoresist layer 20. In accordance with an embodiment of the present invention, the image processing unit 130 may detect color level values and gray level values of pixels constituting the inspection image 30, and may generate color level profiles and a gray level profile of the inspection image 30 from the color level values and the gray level values. Further, the image processing unit 130 may calculate color ratio values from the color level values, and may generate color ratio profiles from the color ratio values.

For example, the image processing unit 130 may detect red level values, green level values, blue level values and gray level values of the pixels constituting the inspection image 30, and may calculate level average values of the red level values, the green level values, the blue level values, and the gray level values in the second direction.

The image processing unit 130 may generate a red level profile, a green level profile, a blue level profile, and a gray level profile of the inspection image 30 in the first direction by using the level average values. Further, the image processing unit 130 may calculate red ratio values, green ratio values, and blue ratio values from the color level average values, that is, red level average values, green level average values, and blue level average values, and may generate a red ratio profile, a green ratio profile, and a blue ratio profile from the red ratio values, green ratio values, and blue ratio values.

As another example, the image processing unit 130 may generate a second inspection image (not shown) having a line shape by merging the pixels constituting the inspection image 30 in the second direction. That is, a second inspection image having a size of 300×1 may be generated from the inspection image 30 having a size of 300×100, and color level profiles, a gray level profile, and color ratio profiles may be generated from the second inspection image.

The control unit 120 may detect a side surface of a layer 20 formed on the wafer 10, that is, a photoresist layer, based on a change in the color profile. For example, the control unit 120 may select one color from among red, green and blue according to a color of the layer 20, and may search a color ratio profile corresponding to the selected color from among the color ratio profiles in the first direction to detect a pixel having a predetermined color ratio of the selected color. In this case, the color of the layer 20 formed on the wafer 10 may be determined by materials constituting the layer 20.

For example, in the case of the photoresist layer 20, a red level may be relatively higher than a green level and a blue level, and thus the control unit 120 may select red from among the red, green, and blue. In such case, the control unit 120 may detect a pixel having a predetermined red ratio by searching the red ratio profile in the first direction, and the detected pixel may be the side surface of the photoresist layer 20. Further, the control unit 120 may calculate a distance between the side surface of the photoresist layer 20 and the side surface of the wafer 10, that is, the width of the EBR region 12.

Meanwhile, color level values of the EBR region 12 of the inspection image 30 may be relatively low compared to the photoresist layer 20 on the wafer 10. Accordingly, even when a red ratio value of the detected pixel is equal to or higher than the predetermined red ratio value, when a red level value of the detected pixel is lower than a predetermined level value, the control unit 120 may determine that the detected pixel is not the side surface of the photoresist layer 20. That is, pixels having color level values lower than a predetermined level value may be included in the EBR region 12, and thus, even when a pixel having a red ratio value equal to or higher than the predetermined ratio value is detected, it is preferable to determine that the detected pixel is not the side surface of the photoresist layer 20.

Further, the EBR region 12 of the inspection image 30 may appear relatively dark compared to the photoresist layer 20 on the wafer 10. Accordingly, when a gray level value of the detected pixel is lower than a predetermined level value, the control unit 120 may determine that the detected pixel is not the side surface of the photoresist layer 20. For example, when a red level value and a gray level value of the detected pixel are higher than the predetermined level value, and a red ratio value of the detected pixel is equal to or higher than the predetermined ratio value, the control unit 120 may determine that the detected pixel is the side surface of the photoresist layer 20.

Referring to FIGS. 5 and 6, pixels having red ratio values higher than a predetermined ratio value may be detected in the EBR region 12. However, in this case, the red level values and gray level values of the detected pixels may be lower than a predetermined level value, for example, 100, and thus, the control unit 120 may determine that the detected pixels are not the side surface of the photoresist layer 20.

Referring to FIGS. 8 and 9, when pixels having red ratio values higher than the predetermined ratio value are detected, and then pixels having red ratio values lower than the preset ratio value are detected, the control unit 120 may determine that the detected pixels are included in the EBR region 12. In accordance with an embodiment of the present invention, when pixels having a red ratio value higher than or equal to the predetermined ratio value are continuously detected by a predetermined number, the control unit 120 may determine that the continuously detected pixels are the photoresist layer 20. Further, the control unit 120 may determine that a first pixel among the continuously detected pixels is the side surface of the photoresist layer 20.

In accordance with an embodiment of the present invention, as shown in FIG. 9, when the red ratio profile has a plurality of inflection points, the control unit 120 may detect a pixel having the predetermined ratio value by searching the red ratio profile in the first direction from an inflection point higher than the predetermined ratio value or an inflection point lower than the predetermined ratio value. For example, when there is an inflection point higher or lower than the predetermined ratio value in a section in which the red level values are higher than the predetermined level value, e.g., 100, the control unit 120 may detect a pixel having the predetermined ratio value by searching the red ratio profile in the first direction from the inflection point.

Hereinafter, the wafer inspection method according to an embodiment of the present invention will be described with reference to the accompanying drawings.

Referring to FIG. 1, in step S110, an inspection image 30 may be acquired from an edge region of the wafer 10. Specifically, although not shown in figures, the step S110 may include acquiring a color image of the wafer 10 by imaging the wafer 10, extracting a first image (not shown) having a substantially circular ring shape corresponding to an edge region of the wafer 10 from the color image, converting the first image into a second image (not shown) having a ribbon shape extending in the second direction, and acquiring the inspection image 30 extending in the first direction by extracting a portion of the second image. Although not shown in figures, a plurality of inspection images 30 may be extracted from the second image in order to inspect a width of the EBR region 12. As an example, the inspection image 30 may be extracted from the second image to have a size of about 300×100.

Meanwhile, the color image may be acquired by the camera unit 110 while the wafer 10 is transferred by the wafer transfer robot 214, and the inspection image 30 may be acquired by the image processing unit 130.

In step S120, a color profile of the inspection image 30 may be generated in a radial direction of the wafer 10. For example, although not shown, the step S120 may include, detecting red level values, green level values, blue level values and gray level values of pixels constituting the inspection image 30, calculating level average values of the red level values, the green level values, the blue level values and the gray level values in the second direction, generating color level profiles and a gray level profile of the inspection image 30 in the first direction using the level average values, and generating color ratio profiles of the inspection image 30 using the color level profiles.

The step S120 may be performed by the image processing unit 130. The image processing unit 130 may generate a red level profile, a green level profile, a blue level profile, a gray level profile, a red ratio profile, a green ratio profile, and a blue ratio profile of the inspection image 30.

As another example, the image processing unit 130 may generate a line-shaped second inspection image by merging pixels of the inspection image 30 in the second direction. That is, the image processing unit 130 may generate a second inspection image having a size of 300×1 from the inspection image 30, and may generate color level profiles, a gray level profile, and color ratio profiles from the second inspection image.

Referring again to FIG. 1, in step S130, A side surface of a layer formed on the wafer 10, for example, a photoresist layer 20, may be detected based on changes in the color profile in the first direction. Specifically, although not shown, the step S130 may include selecting one color from among red, green and blue according to a color of the layer 20, and detecting a pixel having a predetermined color ratio by searching a color ratio profile corresponding to the selected color from among the color ratio profiles in the first direction.

For example, the control unit 120 may select red from among the red, green, and blue, and detect a pixel having a predetermined red ratio by searching the red ratio profile in the first direction.

In particular, when the red level value or the gray level value of the detected pixel is lower than a predetermined level value, the control unit 120 may determine that the detected pixel is not the side surface of the photoresist layer 20, and may detect a second pixel having the predetermined red ratio by searching the red ratio profile in the first direction from the detected pixel.

As another example, the control unit 120 may skip the search in the first direction for pixels having a red level value or a gray level value lower than a predetermined level value. Specifically, pixels in which the red level value or the gray level value is lower than a predetermined value may belong to the EBR region 12, and thus, the control unit 120 may skip the search for a section in which the red level value or the gray level value is lower than a predetermined value. Further, when the red ratio profile has an inflection point higher or lower than the predetermined ratio value in a section in which the red level values are higher than the predetermined level value, for example, 100, the control unit 120 may detect a pixel having the predetermined ratio value by searching the red ratio profile in the first direction from the inflection point. As described above, the time required for detecting the side surface of the photoresist layer 20 may be reduced by skipping the search in the section in which the level value of the selected color or the gray level value is lower than the predetermined level value or starting the search after the inflection point.

After detecting the side of the photoresist layer 20 as described above, in step S140, the control unit 120 may calculate a distance between the side surface of the layer 20 and the side surface of the wafer 10, and may determine whether the EBR process is normally performed from the calculated distance.

In particular, the inspection steps as described above may be repeatedly performed on the plurality of inspection images 30. In such case, the color profile of the EBR region 12 may be different in each of the inspection images 30, and thus, inspection recipes for the inspection images 30 may be set differently. For example, a color selected from each of the inspection images 30 may be changed according to color ratio profiles of the inspection images 30, and a color ratio reference value of the selected color may be changed. Further, a color level value and a gray level value for skipping the search may be set differently for each of the inspection images 30. As described above, different inspection recipes may be set for each of inspection images 30, and the inspection images 30 and the inspection recipes may be stored in a data storage device.

The inspection images 30 may be used as reference images in a subsequent inspection process of wafers. For example, after acquiring an inspection image from a wafer in a subsequent inspection process, the control unit 120 may compare the inspection image with the reference images, and may select a reference image having the highest image matching rate from among the reference images. Then, the control unit 120 may perform the inspection steps on the inspection image by using an inspection recipe corresponding to the selected reference image.

In accordance with the embodiments of the present invention as described above, after the EBR process is performed, the inspection process may be performed using the color image of the wafer 10 acquired while transferring the wafer 10. Accordingly, compared to the prior art, a separate inspection apparatus is not required, and the inspection time and cost may be significantly reduced. In particular, a color for detecting the side surface of the layer 20 formed on the wafer 10 may be selected according to a color ratio of the layer 20, thereby significantly improving the reliability of the inspection process.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

The invention claimed is:
1. A wafer inspection method comprising:
acquiring an inspection image from an edge region of a wafer;
generating a color profile of the inspection image in a radial direction of the wafer; and
detecting a side surface of a layer formed on the wafer based on a change in the color profile in a first direction from a side surface of the wafer toward a center of the wafer,
wherein the detecting the side surface of the layer comprises:
selecting one color from among red, green and blue according to a color of the layer;
searching a color ratio profile corresponding to the selected color from among the color ratio profiles in the first direction to detect a pixel having a predetermined color ratio of the selected color; and
searching the color ratio profile in the first direction from the detected pixel to detect a second pixel having the predetermined color ratio of the selected color when a color level value of the selected color of the detected pixel or a gray level value of the detected pixel is lower than a predetermined value.
2. The wafer inspection method of claim 1, wherein the acquiring the inspection image comprises:
acquiring a color image of the wafer by imaging the wafer;

extracting a ring-shaped first image corresponding to the edge region of the wafer from the color image;
converting the first image into a ribbon-shaped second image; and
extracting a portion of the second image to acquire the inspection image.

3. The wafer inspection method of claim 1, wherein the color profile comprises color level values and gray level values constituting the inspection image.

4. The wafer inspection method of claim 3, wherein the color profile comprises color ratio values calculated from the color level values.

5. The wafer inspection method of claim 1, wherein the generating the color profile comprises:
  detecting red level values, green level values, blue level values and gray level values of pixels constituting the inspection image;
  calculating level average values of the red level values, the green level values, the blue level values and the gray level values in a second direction perpendicular to the first direction; and
  generating color level profiles and a gray level profile of the inspection image in the first direction using the level average values.

6. The wafer inspection method of claim 5, wherein the generating the color profile further comprises:
  generating color ratio profiles of the inspection image using the color level profiles of the inspection image.

7. The wafer inspection method of claim 6, wherein the searching in the first direction is skipped for pixels in which a color level value of the selected color or a gray level value is lower than a predetermined value.

8. The wafer inspection method of claim 6, wherein when an inflection point exists in a section higher or lower than the predetermined color ratio in the color ratio profile, the pixel having the predetermined color ratio is detected by searching the color ratio profile in the first direction from the inflection point.

9. The wafer inspection method of claim 1, further comprising;
  calculating a distance between the side surface of the layer and the side surface of the wafer.

10. A wafer inspection method comprising:
  acquiring a color image of a wafer by imaging the wafer;
  extracting an inspection image corresponding to a portion of an edge region of the wafer from the color image;
  generating color ratio profiles of the inspection image in a radial direction of the wafer;
  detecting a side surface of a layer formed on the wafer based on a change in one of the color ratio profiles in a first direction from a side surface of the wafer toward a center of the wafer; and
  calculating a distance between the side surface of the layer and the side surface of the wafer,
  wherein the detecting the side surface of the layer comprises:
  selecting one color from among red, green and blue according to a color of the layer;
  searching a color ratio profile corresponding to the selected color from among the color ratio profiles in the first direction to detect a pixel having a predetermined color ratio of the selected color; and
  searching the color ratio profile in the first direction from the detected pixel to detect a second pixel having the predetermined color ratio of the selected color when a gray level value of the detected pixel is lower than a predetermined value.

11. The wafer inspection method of claim 10, wherein the extracting the inspection image comprises:
  extracting a ring-shaped first image corresponding to the edge region of the wafer from the color image;
  converting the first image into a ribbon-shaped second image; and
  extracting a portion of the second image to acquire the inspection image.

12. The wafer inspection method of claim 10, wherein the generating the color ratio profiles comprises:
  detecting red level values, green level values and blue level values of pixels constituting the inspection image;
  calculating level average values of the red level values, the green level values and the blue level values in a second direction perpendicular to the first direction;
  generating a red level profile, a green level profile and a blue level profile of the inspection image in the first direction using the level average values; and
  generating a red ratio profile, a green ratio profile and a blue ratio profile of the inspection image in the first direction using the level average values.

13. The wafer inspection method of claim 10, further comprising:
  generating a gray level profile of the inspection image in the radial direction of the wafer.

14. The wafer inspection method of claim 13, wherein the generating the gray level profile comprises:
  detecting gray level values of pixels constituting the inspection image;
  calculating level average values of the gray level values in a second direction perpendicular to the first direction; and
  generating the gray level profile of the inspection image in the first direction using the level average values.

15. The wafer inspection method of claim 13, wherein the searching in the first direction is skipped for pixels in which a gray level value is lower than a predetermined value.

16. A wafer inspection method comprising:
  acquiring a color image of a wafer by imaging the wafer;
  extracting a ring-shaped first image corresponding to an edge region of the wafer from the color image;
  converting the first image into a ribbon-shaped second image;
  extracting a portion of the second image to acquire an inspection image;
  merging pixels of the inspection image in a second direction perpendicular to a first direction from a side surface of the wafer toward a center of the wafer to acquire a second inspection image having a line shape extending in the first direction;
  generating a color profile of the second inspection image in the first direction; and
  detecting a side surface of a layer formed on the wafer based on a change in the color profile in the first direction,
  wherein the detecting the side surface of the layer comprises:
  selecting one color from among red, green and blue according to a color of the layer;
  searching a color ratio profile corresponding to the selected color from among the color ratio profiles in the first direction to detect a pixel having a predetermined color ratio of the selected color; and
  searching the color ratio profile in the first direction from the detected pixel to detect a second pixel having the predetermined color ratio of the selected color when a gray level value of the detected pixel is lower than a predetermined value.

\* \* \* \* \*